United States Patent
Demir et al.

(10) Patent No.: US 7,460,614 B2
(45) Date of Patent: Dec. 2, 2008

(54) METHOD AND SYSTEM FOR ADJUSTING THE AMPLITUDE AND PHASE CHARACTERISTICS OF REAL AND IMAGINARY SIGNAL COMPONENTS OF COMPLEX SIGNALS PROCESSED BY AN ANALOG RADIO TRANSMITTER

(75) Inventors: Alpaslan Demir, Commack, NY (US); Leonid Kazakevich, Plainview, NY (US); Kenneth P. Kearney, Smithtown, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 1125 days.

(21) Appl. No.: 10/740,047

(22) Filed: Dec. 18, 2003

(65) Prior Publication Data

US 2004/0264598 A1    Dec. 30, 2004

Related U.S. Application Data

(60) Provisional application No. 60/482,312, filed on Jun. 25, 2003.

(51) Int. Cl.
*H04B 1/00* (2006.01)
*H04L 27/00* (2006.01)
*H04L 27/36* (2006.01)

(52) U.S. Cl. .................. 375/298; 375/295; 375/146

(58) Field of Classification Search .............. 375/219, 375/255, 235, 261, 296, 297, 298, 302, 146, 375/295
See application file for complete search history.

(56) References Cited

U.S. PATENT DOCUMENTS

| | | | | |
|---|---|---|---|---|
| 4,700,151 A * | 10/1987 | Nagata | .......... | 332/123 |
| 5,111,155 A * | 5/1992 | Keate et al. | .......... | 330/149 |
| 5,699,383 A * | 12/1997 | Ichiyoshi | .......... | 375/297 |
| 6,044,112 A * | 3/2000 | Koslov | .......... | 375/235 |
| 6,091,941 A * | 7/2000 | Moriyama et al. | .......... | 455/126 |
| 6,222,878 B1 * | 4/2001 | McCallister et al. | .......... | 375/225 |
| 6,373,902 B1 * | 4/2002 | Park et al. | .......... | 375/296 |
| 6,587,513 B1 * | 7/2003 | Ichihara | .......... | 375/296 |
| 7,248,625 B2 * | 7/2007 | Chien | .......... | 375/219 |
| 2002/0015450 A1 * | 2/2002 | Ratto | .......... | 375/261 |
| 2003/0007574 A1 * | 1/2003 | Li et al. | .......... | 375/316 |
| 2003/0118126 A1 * | 6/2003 | Moon et al. | .......... | 375/298 |

* cited by examiner

*Primary Examiner*—Mohammad Ghayour
*Assistant Examiner*—Lawrence B Williams
(74) *Attorney, Agent, or Firm*—Volpe and Koenig, P.C.

(57) ABSTRACT

A method and system for determining amplitude and phase compensation values used to adjust the amplitude and phase characteristics of real and imaginary signal components of complex signals processed by an analog radio transmitter. The compensation values may be determined in response to detecting a significant temperature change in the transmitter. Corresponding amplitude and phase adjustment signals having levels that correspond to the compensation values are provided to respective amplitude and phase imbalance compensation modules to adjust the amplitude and phase characteristics of at least one of the real and imaginary signal components.

84 Claims, 5 Drawing Sheets

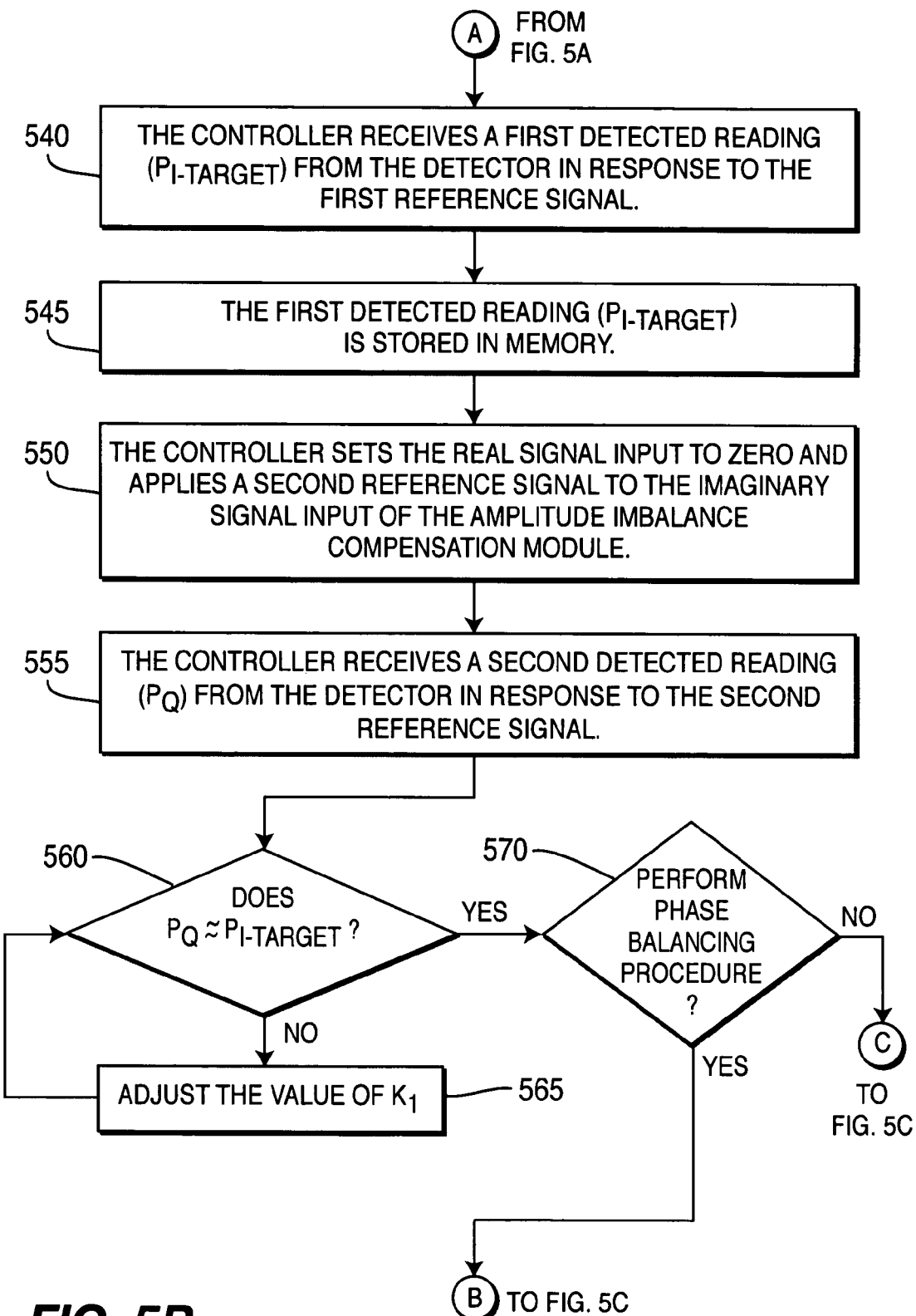

METHOD AND SYSTEM FOR ADJUSTING THE AMPLITUDE AND PHASE CHARACTERISTICS OF REAL AND IMAGINARY SIGNAL COMPONENTS OF COMPLEX SIGNALS PROCESSED BY AN ANALOG RADIO TRANSMITTER

CROSS REFERENCE TO RELATED APPLICATION(S)

This application claims priority from U.S. provisional application No. 60/482,312, filed Jun. 25, 2003, which is incorporated by reference as if fully set forth.

FIELD OF THE INVENTION

The present invention generally relates to transmitter design in wireless communication systems. More particularly, the present invention relates to digital signal processing (DSP) techniques used to adjust phase and amplitude imbalances in an analog radio transmitter.

BACKGROUND

Existing wireless system architectural configurations impose stringent constraints on the system designer with regards to transmitting communication signals. Moreover, such configurations often provide low reliability communication links, high operating costs, and an undesirably low level of integration with other system components.

In the radio frequency (RF) section of a conventional low-cost wireless transmitter configured with analog components, a considerable level of distortion occurs when RF signals are processed. Higher cost components with better distortion characteristics that enhance signal quality may be overlooked during the design phase in order to reduce the cost of the end-product.

For example, a conventional wireless communication system typically uses a modulator to modulate a complex signal which is made up of a real component and an imaginary component, referred to as the in-phase (I) signal component and the quadrature (Q) signal component, respectively. A common problem associated with such systems is that amplitude imbalance occurs in the complex signal because the power of the I component is not equal to the power of the Q component, and phase imbalance occurs in the complex signal because the I and Q signal components deviate from phase quadrature, i.e., they differ by more or less than 90 degrees because they are not orthogonal.

In summary, amplitude and phase imbalances cause a distortion in the signal constellation and can drastically impact the overall performance of the communication system. It is desired to provide a digital baseband (DBB) system, including a low cost transmitter with low noise and minimal power requirements. Such a DBB system would utilize DSP techniques to provide an improved and less complex method and system for compensating for amplitude and phase imbalances in an analog radio transmitter.

SUMMARY

A method and system for determining amplitude and phase compensation values used to adjust the amplitude and phase characteristics of real and imaginary signal components of complex signals processed by an analog radio transmitter. The compensation values may be determined in response to detecting a significant temperature change in the transmitter. Corresponding amplitude and phase adjustment signals having levels that correspond to the compensation values are provided to respective amplitude and phase imbalance compensation modules to adjust the amplitude and phase characteristics of at least one of the real and imaginary signal components.

The present invention may be incorporated into a DBB transmitter, a WTRU, an IC, a wireless communication system and method, or any other desired communication mechanism. The present invention includes a digital amplitude imbalance compensation module, a phase imbalance compensation module and a controller. Each of the compensation modules has a real and imaginary signal path.

The digital amplitude imbalance compensation module is configured to adjust the amplitude characteristics of the real and imaginary signal paths. The digital phase imbalance compensation module is configured to adjust the phase difference between the real and imaginary signal paths.

The controller is in communication with the each of the compensation modules. The controller is configured to determine an amplitude compensation value used to adjust the amplitude characteristics of the imaginary signal path such that the real and imaginary signal paths substantially have the same amplitude. Furthermore, the controller is configured to determine a phase compensation value used to adjust the phase difference between the real and imaginary signal paths to 90 degrees, such that the paths are orthogonal to each other.

The present invention may further include a modem switchably connected to the real and imaginary signal paths of the digital amplitude imbalance compensation module via first and second switches. The first and second switches may be connected to the real and imaginary signal outputs of the modem, the real and imaginary signal paths of the digital amplitude imbalance compensation module and the controller. The amplitude and phase compensation values are determined after the switches disconnect the modem from the real and imaginary signal paths of the digital amplitude imbalance compensation module and connect the controller to the real and imaginary signal paths of the digital amplitude imbalance compensation module.

The controller may disable the imaginary signal path of the digital amplitude imbalance compensation module and apply a first reference signal to the real signal path of the digital amplitude imbalance compensation module. In response to the first reference signal, the controller receives a first detected reading having a value $P_{I\text{-}TARGET}$.

The controller may then disable the real signal path of the digital amplitude imbalance compensation module and apply a second reference signal to the imaginary signal path of the digital amplitude imbalance compensation module. In response to the second reference signal, the controller receives a second detected reading having a value $P_Q$.

The controller may then compare the value of $P_{I\text{-}TARGET}$ to the value of $P_Q$. If the values of $P_{I\text{-}TARGET}$ and $P_Q$ are not substantially the same, the controller may incrementally adjust the value of the amplitude compensation value until the values of $P_{I\text{-}TARGET}$ and $P_Q$ are substantially the same. The controller may then simultaneously apply the first reference signal to the real signal path and the second reference signal to the imaginary signal path, and reduce the power level of the first and second reference signals by half. In response to the simultaneously applied first and second reference signals, the controller may receive a third detected reading having a value $P_{PHASE\text{-}ERROR}$ in response. The controller may then compare the value of $P_{PHASE\text{-}ERROR}$ to the value of $P_{I\text{-}TARGET}$. If the values of $P_{PHASE\text{-}ERROR}$ and $P_{I\text{-}TARGET}$ are not substantially the same, the controller may incrementally adjust the value of the phase compensation value until the values of $P_{PHASE-ERROR}$ and $P_{I-TARGET}$ are substantially the same, indicating that the phases of the real and imaginary signal paths are orthogonal to each other.

The present invention may further include an analog radio transmitter in communication with the digital amplitude imbalance compensation module and the digital phase imbalance compensation module, and a memory in communication with the controller. The memory may store at least one of the phase and amplitude compensation values.

The analog radio transmitter may include a temperature sensor in communication with the controller. The controller may determine the amplitude and phase compensation values if the temperature sensor detects a change in temperature greater than a predetermined threshold, or a temperature excursion beyond a predetermined value or range. The analog radio transmitter may further include an amplifier. The controller may set the amplifier to a predetermined gain level, prior to determining the amplitude and phase compensation values. The controller may set a previously determined phase and/or amplitude compensation values to zero, prior to determining a new phase compensation value.

The present invention may process communication signals which include first and second time slots separated by a guard period. The controller may determine the amplitude and phase compensation values during at least a portion of the guard period.

The digital phase imbalance compensation module may be configured to include a first adder having first and second inputs and a first output, a second adder having third and fourth inputs and a second output, a first multiplier having fifth and sixth inputs and a third output, and a second multiplier having seventh and eighth inputs and a fourth output. The first input may be coupled to the real signal input of the digital phase imbalance compensation module, and the first output may be coupled to a real signal output of the digital phase imbalance compensator module. The third input may be coupled to the imaginary signal input of the digital phase imbalance compensation module, and the first output may be coupled to an imaginary signal output of the digital phase imbalance compensator module. The fifth input may be coupled to the imaginary signal input of the digital phase imbalance compensation module, and the third output may be coupled to the second input of the first adder. The seventh input may be coupled to the real signal input of the digital phase imbalance compensation module. The fourth output may be coupled to the fourth input of the first adder, and the eight input of the second multiplier may be coupled to the sixth input of the first multiplier and to the controller for receiving the phase adjustment signal.

The digital amplitude imbalance compensation module may include a multiplier and an adder. The multiplier may have a first input coupled to the imaginary signal input of the digital amplitude imbalance compensation module, a second input coupled to the controller for receiving the amplitude adjustment signal, and a first output. The adder may have a third input coupled to the imaginary signal input of the digital amplitude imbalance compensation module, a fourth input connected to the output of the multiplier, and a second output connected to an imaginary signal output of the digital amplitude imbalance compensation module.

BRIEF DESCRIPTION OF THE DRAWINGS

A more detailed understanding of the invention may be had from the following description of a preferred example, given by way of example and to be understood in conjunction with the accompanying drawing wherein:

FIGS. 5A, 5B and 5C, taken together, are a flow chart of a process used to determine an amplitude compensation value for adjusting the digital amplitude imbalance compensation module of FIG. 2 and, optionally, a phase compensation value for adjusting the digital phase imbalance compensation module of FIG. 3.

DETAILED DESCRIPTION OF THE PREFERRED EMBODIMENTS

Figure 1:
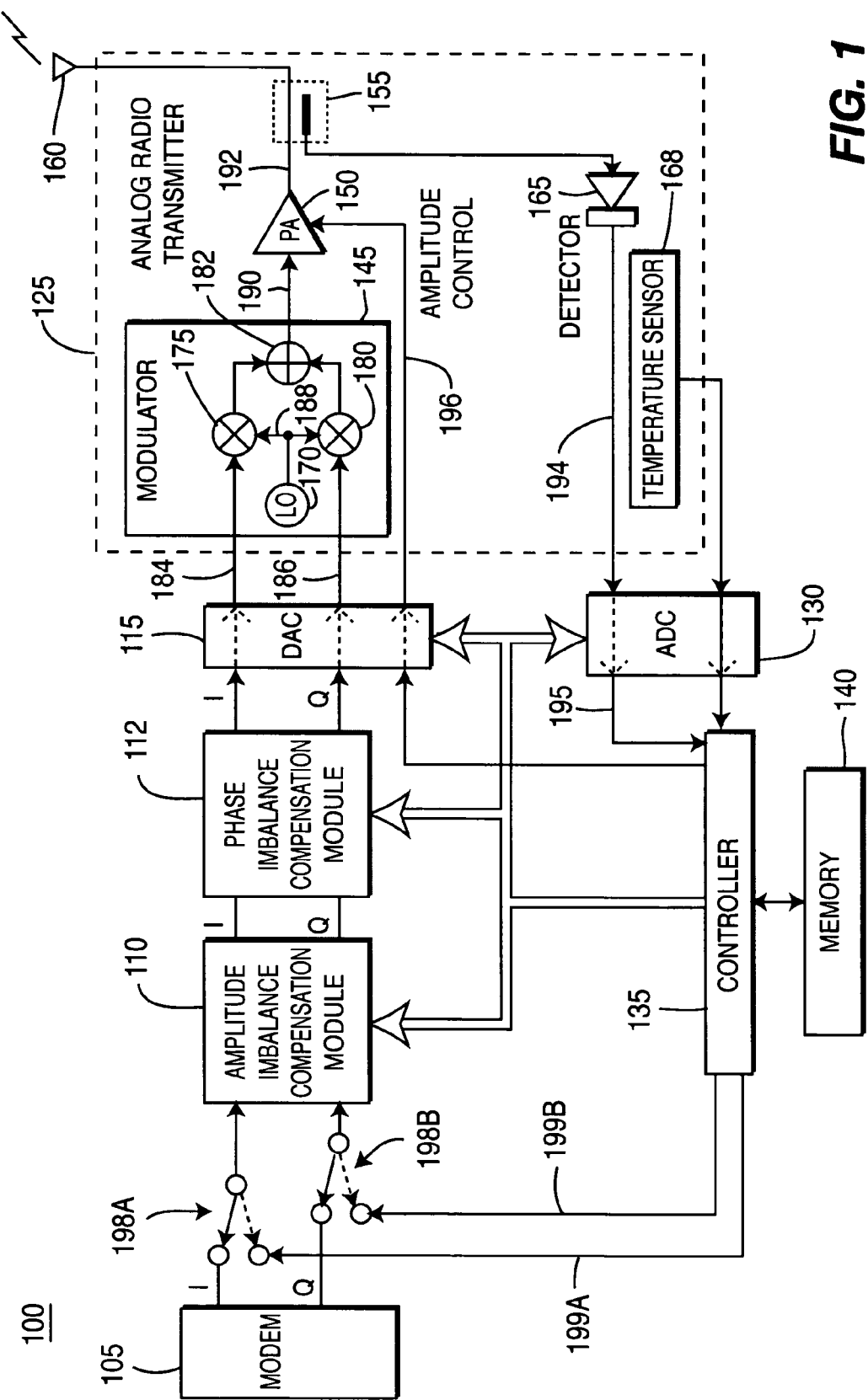
FIG. 1 is a block diagram of a DBB RF transmitter with digital amplitude and phase imbalance compensation modules configured in accordance with a preferred embodiment of the present invention.

FIG. 1 is a block diagram of a DBB RF transmitter 100, configured in accordance with a preferred embodiment of the present invention. Although the invention will be referred to in terms of being implemented upon a transmitter 100, it should also be understood by those of skill in the art that the invention pertains equally to a transceiver. However, for simplicity, the invention will be described in terms of being implemented upon a transmitter 100.

Preferably, the method and system disclosed herein is incorporated into a wireless transmit/receive unit (WTRU). Hereafter, a WTRU includes but is not limited to a user equipment, mobile station, fixed or mobile subscriber unit, pager, or any other type of device capable of operating in a wireless environment. The features of the present invention may be incorporated into an integrated circuit (IC) or be configured in a circuit comprising a multitude of interconnecting components.

The present invention is applicable to communication systems using time division duplex (TDD), time division multiple access (TDMA), frequency division duplex (FDD), code division multiple access (CDMA), CDMA 2000, time division synchronous CDMA (TDSCDMA), and orthogonal frequency division multiplexing (OFDM). However, the present invention is envisaged to be applicable to other types of communication systems as well.

As shown in FIG. 1, the DBB RF transmitter 100 includes a modem 105, a digital amplitude imbalance compensation module 110, a digital phase imbalance compensation module 112, at least one digital to analog converter (DAC) 115, an analog radio transmitter 125, at least one analog to digital converter (ADC) 130, a controller 135 and a read-write memory 140.

The analog radio transmitter 125 includes a modulator 145, a power amplifier (PA) 150, a coupling unit (e.g., a directional coupler or sample transmission line) 155, an antenna 160, a detector 165 and a temperature sensor 168.

The modulator 145 of the analog radio transmitter 125 includes an LO 170, first and second modulators 175, 180, and an adder 182.

In the DBB RF transmitter 100, the modem 105 outputs in-phase (I) and quadrature (Q) signal components to the DAC 115 via the digital amplitude and phase imbalance compensation modules 110, 112. Based on the I and Q signal components, the DAC 115 outputs a real analog signal 184 to the first modulator 175, and an imaginary analog signal 186 to the second modulator 180. The LO 170 of the modulator 145 provides an LO input signal 188 to each of the first and second modulators 175, 180. The outputs of the first and second modulators 175, 180 are summed together by the adder 182 to generate an analog complex modulated signal 190 which is input to the PA 150. In response to receiving the complex modulated signal 190, the PA 150 outputs a transmitter output signal 192, which is output from antenna 160 of the analog radio transmitter 125. The transmitter output signal 192 is monitored by the detector 165 via the coupling unit 155. The detector 165 generates a feedback signal 194 which provides a detected reading having a magnitude that is a function of the transmitter output signal 192.

The ADC 130 receives the feedback signal 194 and outputs a digital signal 195 to the controller 135. The controller 135 may provide an amplitude control signal 196 to PA 150, via the DAC 115, to control the gain of the amplifier 150, and thus the amplitude of transmitter output signal 192. The controller 135 may also control the operation of the DAC 115 and the ADC 130 based on various values stored in the memory 140.

The DBB RF transmitter 100 further includes switches 198A and 198B which are coupled to the modem 105 and the controller 135. During normal operation, the switches 198A and 198B couple the I and Q signal outputs of the modem 105 to the respective I and Q signal inputs of the digital amplitude imbalance compensation module 110. When it is necessary to perform an amplitude and phase balancing procedure, the controller 135 may signal the switches 198A, 198B to connect the I (real) and Q (imaginary) signal inputs of the digital amplitude imbalance compensation module 110 to the controller 135, such that the controller 135 may input signals 199A, 199B to the real and imaginary inputs of the digital amplitude and phase imbalance compensation modules 110, 112 to determine the extent of amplitude and phase imbalances between the I and Q signal components. Based on power readings performed by the detector 165, the controller 135 eliminates the amplitude and phase imbalances by controlling the amplitude and phase imbalance compensation modules 110, 112. An amplitude compensation value $K_1$ and a phase error compensation value $K_p$ are determined based on the power measurements performed by the detector 165, and are used to balance the amplitude and phase of the I and Q signal components throughout the DBB RF transmitter 100.

Figure 2:
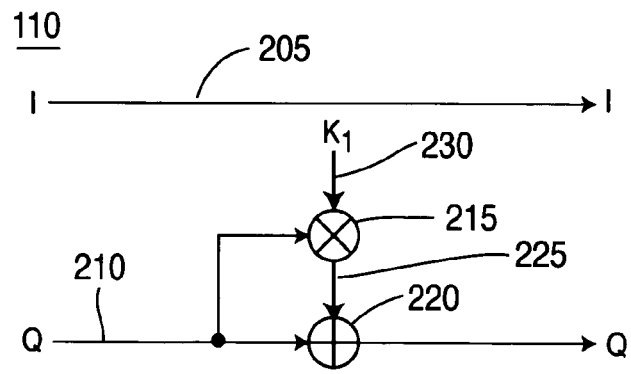
FIG. 2 shows an exemplary configuration of the digital amplitude imbalance compensation module in the DBB RF transmitter of FIG. 1.

FIG. 2 shows an exemplary configuration of the digital amplitude imbalance compensation module 110 having real (I) and imaginary (Q) signal paths 205, 210. The digital amplitude imbalance compensation module 110 further includes a multiplier 215 and an adder 220. When an amplitude adjustment signal 230 having a level corresponding to an amplitude compensation value $K_1$ is provided to the multiplier 215 by the controller 135, the amplitude adjustment signal 230 is multiplied with the signal on the imaginary signal path 210 via the multiplier 215, and the resulting product 225 is then added to the signal on the imaginary signal path 210 via the adder 220, such that the amplitude of the signal on the imaginary signal path 210, (also referred to as the amplitude of the imaginary signal path), is adjusted to be the same as the amplitude of the signal on the real signal path 205 (also referred to as the amplitude of the real signal path). Note that the sole purpose of the multiplier 215 is to avoid the unintentional deactivation of the imaginary signal path 210 if the value of $K_1$=0. Alternatively, the configuration of multiplier 215 and adder 220 may be incorporated into the real signal path 205, or into both of the real and imaginary signal paths, 205, 210.

Figure 3:
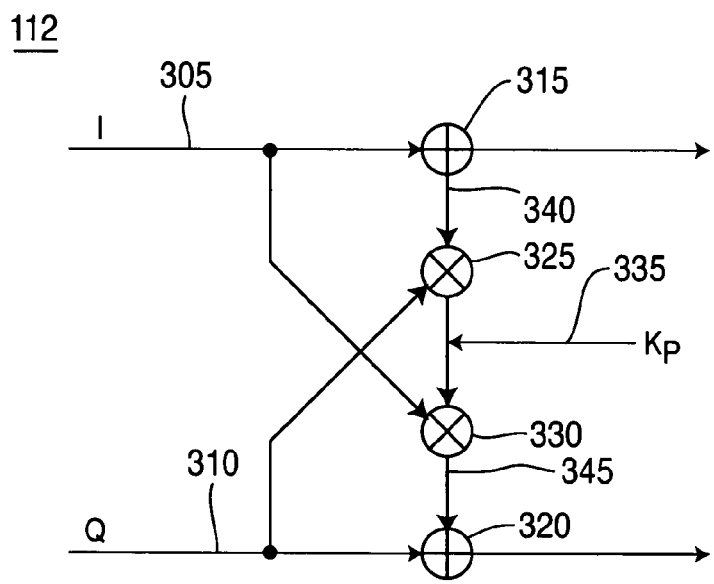
FIG. 3 shows an exemplary configuration of the digital phase imbalance compensation module in the DBB RF transmitter of FIG. 1.

FIG. 3 shows an exemplary configuration of the digital phase imbalance compensation module 112 having real (I) and imaginary (Q) signal paths 305, 310. The digital phase imbalance compensation module 112 further includes adders 315, 320 and multipliers 325, 330. When a phase adjustment signal 335 having a level corresponding to a phase error compensation value $K_p$ is provided to the multipliers 325, 330 by the controller 135, the phase adjustment signal 335 is multiplied with signals on each of the real and imaginary signal paths 305, 310 via the multipliers 325, 330, and the resulting products 340, 345 are added to the signals on the real and imaginary signal paths 305, 310, respectively, such that the phase difference between the real and imaginary signal paths is adjusted to 90 degrees.

Based on the phase adjustment signal 335, the digital phase imbalance compensation module 112 rotates the constellation such that when the phase difference between the real and imaginary paths 305, 310 is 90 degrees, the real and imaginary characteristics of the paths 305, 310 are the same in all four quadrants of the constellation, thus forming a perfect square in the constellation.

The insertion digital phase imbalance compensation module 112 receives a real (Re) I signal component 305 and an imaginary (jIm) Q signal component 310 and rotates the phase of the signal components Re and jIm by x degrees ($e^{jx}$) as described by Equation 1 below:

$$(Re+jIm) \times e^{jx} \qquad \text{Equation 1}$$

The outcome of the real output, $\hat{R}e$, is described by Equation 2 below:

$$\hat{R}e = (\cos(x) \times Re) + (\sin(x) \times Im) \qquad \text{Equation 2}$$

Note that if x is close to zero, then $\cos(x)=1.0$ and $\sin(x)=x$, as described by Equation 3 below:

$$\hat{R}e = Re + Im \times x \qquad \text{Equation 3}$$

The output of the imaginary output, $\hat{I}m$, is described by Equation 4 below:

$$\hat{I}m = (\sin(x) \times Re) + (\cos(x) \times Im) \qquad \text{Equation 4}$$

Note that if x is close to zero, then $\cos(x)=1.0$ and $\sin(x)=x$, as described by Equation 5 below:

$$\hat{I}m = Im + Re \times x \qquad \text{Equation 5}$$

Figure 4:
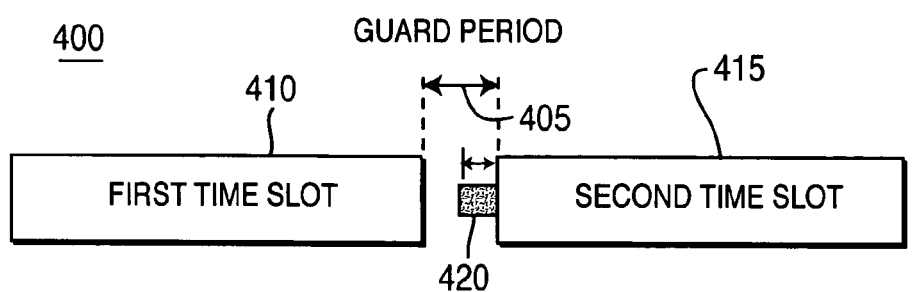
FIG. 4 illustrates an example of a communication signal processed by the DBB RF transmitter of FIG. 1.
Figure 4:

FIG. 4 illustrates an example of a communication signal 400 having a guard period 405 which occurs between two time slots 410, 415. This exemplary communication signal may be used under the presumption that the DBB RF transmitter 100 is a TDD, TDMA, TDSCDMA or other time-slotted transmitter. In this example, data in the communication signal 400 is communicated via the time slots 410 and 415. Thus, the only time that adjustments for implementing the amplitude and phase adjustment procedure without disrupting the data in the time slots 410, 415, of the communication signal 400, is during at least a portion of one or more guard periods, such as guard period 405. In accordance with one embodiment of the present invention, an amplitude and/or phase balancing procedure 420 may be performed during at least a portion of at least one guard period 405.

Figure 5A:
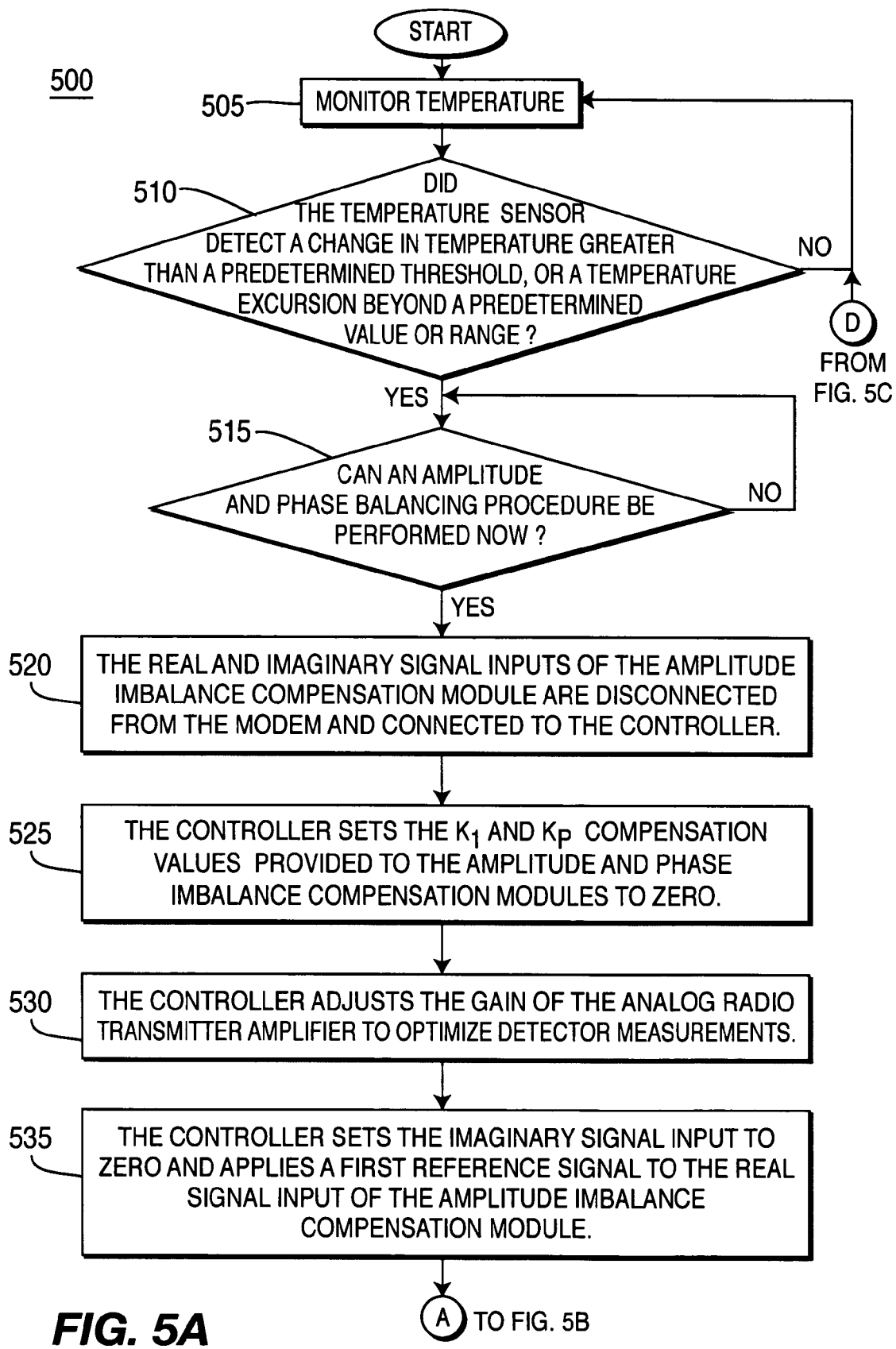
Figure 5C:
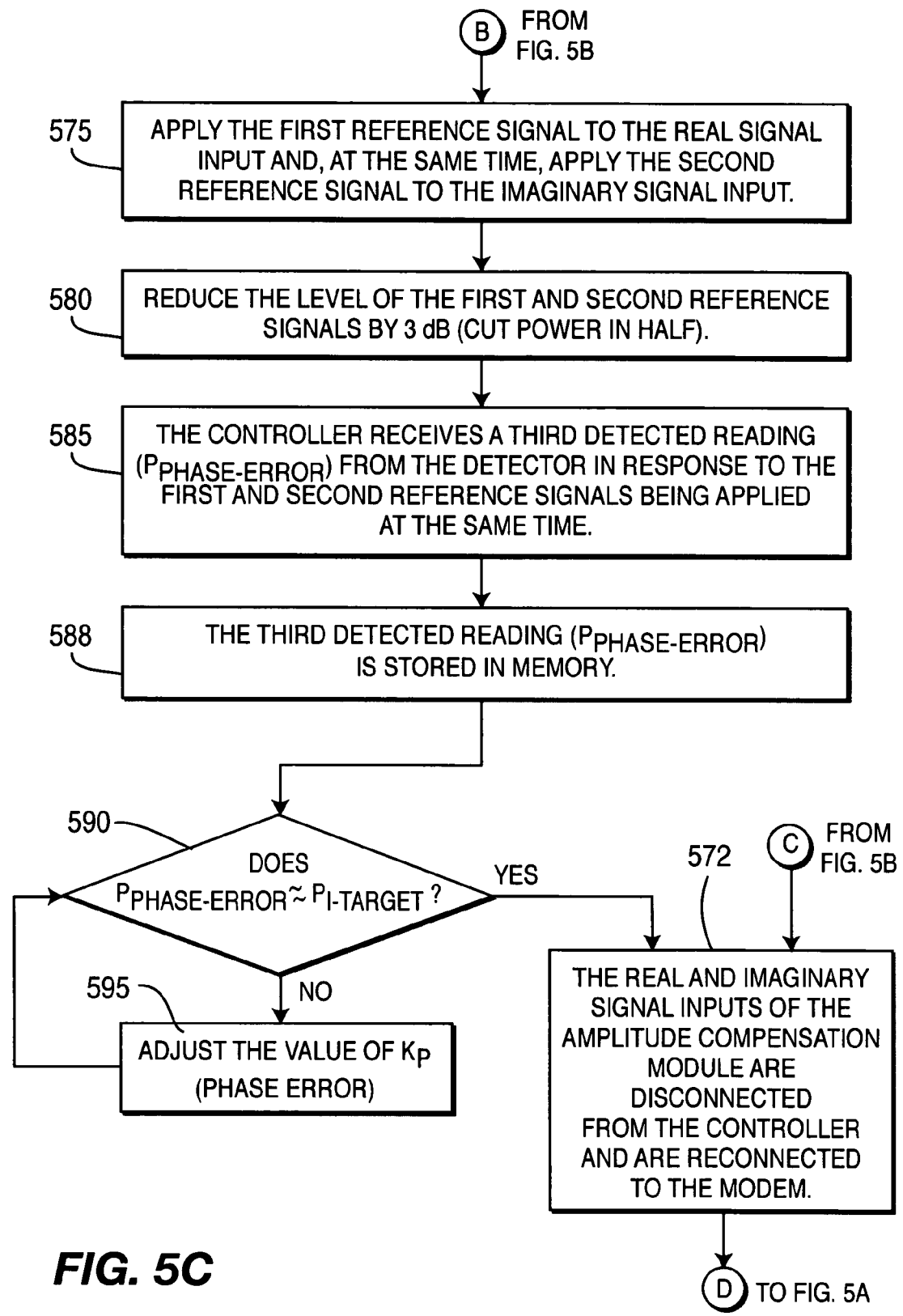

FIGS. 5A, 5B and 5C, taken together, are a flow chart of an exemplary process 500 which includes method steps used to determine an amplitude compensation value for adjusting the digital amplitude imbalance compensation module 110 and, optionally, a phase compensation value for adjusting the digital phase imbalance compensation module 112 in accordance with a preferred embodiment of the present invention. In step 505, the temperature of the analog radio transmitter 125 or a particular component therein is monitored by the temperature sensor 168.

If, in step 510, the temperature sensor 168 indicates to the controller 135 the occurrence of a change in temperature greater than a predetermined threshold, or a temperature excursion beyond a predetermined value or range, a determination is made in step 515 as to whether an amplitude and phase balancing procedure, including steps 520-595, may be performed. Such a procedure may not be performed when use of the modem 105 is required. For example, if the DBB RF transmitter 100 is used in a TDD or TDMA system to process the time-slot based communication signal 400 shown in FIG. 4, the process 500 will remain at step 515 until after the data in the first time slot 410 is processed and the guard period 405 begins before proceeding with step 520 of the amplitude and phase balancing procedure.

Steps 510 and 515 may be bypassed during initialization of the DBB RF transmitter 100, whereby the controller 135 may update the amplitude compensation value $K_1$ and the phase error compensation value $K_p$, prior to normal use of the DBB RF transmitter 100. Furthermore, an update of the amplitude and phase compensation values $K_1$ and $K_p$ may be performed repeatedly, periodically, in response to temperature monitored by the temperature sensor 168, or in accordance with another type of control scheme. For example, in step 510, a bias current detector or any other device which detects a parameter that may affect the amplitude and phase characteristics of the I and Q signal components of the DBB RF transmitter 100 may be used, alone or in conjunction with the temperature sensor 168, to initiate the amplitude and phase balancing procedure.

In step 520, the first actual step of balancing the amplitude and, optionally, the phase of the I (real) and Q (imaginary) signal components of the DBB RF transmitter 100 is initiated by the controller 135 instructing switches 198A, 198B to disconnect the real and imaginary signal inputs of the digital amplitude imbalance compensation module 110 from the modem 105 and instead connecting the real and imaginary signal inputs of the digital amplitude imbalance compensation module 110 to the controller 135. In step 525, the controller 135 sets the amplitude compensation value $K_1$ that is provided to the digital amplitude imbalance compensation module 110 and the phase compensation value $K_p$ that is provided to digital phase imbalance compensation module 112 to zero. Alternatively, the controller 135 may use the amplitude and phase balancing procedure to adjust the existing values of $K_1$ and $K_p$. In step 530, the controller 135 sets the gain of the PA 150 to a predetermined value via the amplitude control signal 192 in order to optimize the measurements performed by the detector 165.

In step 535, the controller 135 sets the imaginary signal input of the digital amplitude imbalance compensation module 110 to zero and applies a first reference signal to the real signal input of the digital amplitude imbalance compensation module 110. In step 540, a first detected reading ($P_{I-TARGET}$) for the real signal input is received by the controller 135 in response to the applied first reference signal. In step 545, the controller 135 stores the first detected reading ($P_{I-TARGET}$) in the memory 140. In step 550, the controller 135 sets the real signal input (i.e., the real signal path) of the digital amplitude imbalance compensation module 110 to zero and applies a second reference signal to the imaginary signal input (i.e., the imaginary signal path) of the digital amplitude imbalance compensation module 110. Although each of the first and second reference signals are routed over two different signal paths, it should be understood that the first and second reference signals may be identical in every other way (e.g., they each may be generated by the same source and they each may have the same amplitude characteristics).

In step 555, a second detected reading ($P_Q$) for the imaginary signal input is received by the controller 135 in response to the applied second reference signal. In step 560, the value of $PI_{I-TARGET}$ is compared to the value of $P_Q$. If there is a significant difference between the values of $P_{I-TARGET}$ and $P_Q$, the controller 135 adjusts (i.e., increments) the amplitude compensation value $K_1$ to change the amplitude characteristics of the imaginary signal path and another detected reading $P_Q$ is received by the controller 135 (step 565). Steps 560 and 565 are repeated until each of the values of $P_{I-TARGET}$ and $P_Q$ is within a predefined acceptable tolerance of each other and are substantially equivalent (i.e., the same), indicating that the amplitude of the real and imaginary (I and Q) signal components are balanced. Thus, the amplitude balancing portion of the procedure is complete.

In step 570, a determination is made as to whether the phase balancing portion of the procedure should be implemented. If the phase balancing portion of the procedure is not to be implemented, the process 500 then proceeds to step 572 where the controller 135 instructs the switches 198A, 198B to disconnect the real and imaginary signal inputs of the digital amplitude imbalance compensation module 110 from the controller 135 and reconnect the real and imaginary signal inputs of the digital amplitude imbalance compensation module 110 to the modem 105. The process 500 then returns to the temperature monitoring step 505.

If, in step 570, it is determined to commence with the phase balancing portion of the procedure, the first and second reference signals are respectively applied to the real and imaginary signal inputs of the amplitude imbalance compensation module 110, at the same time (step 575), and the power level of each of the first and second reference signals is reduced by 3 dB (i.e., cut in half) (step 580).

In step 585, a third detected reading ($P_{PHASE-ERROR}$) is received by the controller 135 in response to the simultaneously applied first and second reference signals. In step 588, the controller 135 stores the third detected reading ($P_{PHASE-ERROR}$) in the memory 140. In step 590, the value of $P_{PHASE-ERROR}$ is compared to the value of $P_{I-TARGET}$. If there is a significant difference between the values of $P_{PHASE-ERROR}$ and $P_{I-TARGET}$, (i.e., the phase difference between the real and imaginary signal paths), the controller 135 adjusts (i.e., increments) the phase compensation value $K_p$ and another detected reading $P_{PHASE-ERROR}$ is received by the controller 135 (step 595). Steps 590 and 595 are repeated until each of the values of $P_{PHASE-ERROR}$ and $P_{I-TARGET}$ is within a predefined acceptable tolerance of each other and/or are substantially equivalent, indicating that the phases of the real and imaginary (I and Q) signal paths are orthogonal to each other. Thus, the phase balancing portion of the procedure is complete.

The process 500 then proceeds to step 572 where the controller 135 instructs the switches 198A, 198B to disconnect the real and imaginary signal inputs of the digital amplitude imbalance compensation module 110 from the controller 135 and reconnect the real and imaginary signal inputs of the digital amplitude imbalance compensation module 110 to the modem 105. The process 500 then returns to the temperature monitoring step 505.

In one embodiment, the amplitude of the real and imaginary signal paths may be adjusted without adjusting the phase difference between the real and imaginary signal paths, as indicated by the "NO" output of decision diamond 570 of process 500. In another embodiment, both the amplitude and phase adjustments may be implemented, as indicated by the "YES" output of decision diamond 570 of process 500. In yet another embodiment, the phase difference between the real and imaginary signal paths may be independently adjusted, (i.e., without readjusting the amplitude of the signal paths, by retrieving a previously stored value of $P_{I\text{-}TARGET}$ from the memory 140 and then proceeding with steps 575-595 of process 500, as previously described.

While this invention has been particularly shown and described with reference to preferred embodiments, it will be understood by those skilled in the art that various changes in form and details may be made therein without departing from the scope of the invention described hereinabove.

What is claimed is:

1. A digital baseband (DBB) transmitter comprising:
    a digital amplitude imbalance compensation module having real and imaginary signal paths, the digital amplitude imbalance compensation module being configured to adjust the amplitude characteristics of the real and imaginary signal paths;
    a controller in communication with the digital amplitude imbalance compensation module, the controller being configured to determine an amplitude compensation value used to adjust the amplitude characteristics of the imaginary signal path such that the real and imaginary signal paths substantially have the same amplitude;
    a digital chase imbalance compensation module in communication with the controller and having real and imaginary signal paths in communication with the real and imaginary signal paths of the digital amplitude imbalance compensation module, respectively, wherein the controller determines a phase compensation value used by the digital phase imbalance compensation module to adjust the phase difference between the real and imaginary signal paths to 90 degrees;
    a modem switchably connected to the real and imaginary signal paths of the digital amplitude imbalance compensation module, the modem having real and imaginary signal outputs; and
    first and second switches connected to the real and imaginary signal outputs of the modem, the real and imaginary signal paths of the digital amplitude imbalance compensation module and the controller, wherein the amplitude and phase compensation values are determined after the switches disconnect the modem from the real and imaginary signal paths of the digital amplitude imbalance compensation module and connect the controller to the real and imaginary signal paths of the digital amplitude imbalance compensation module.

2. The DBB transmitter of claim 1 wherein the controller disables the imaginary signal path of the digital amplitude imbalance compensation module, applies a first reference signal to the real signal path of the digital amplitude imbalance compensation module, and receives a first detected reading having a value $P_{I\text{-}TARGET}$ in response to the first reference signal.

3. The DBB transmitter of claim 2 wherein the controller disables the real signal path of the digital amplitude imbalance compensation module, applies a second reference signal to the imaginary signal path of the digital amplitude imbalance compensation module, and receives a second detected reading having a value $P_Q$ in response to the second reference signal.

4. The DBB transmitter of claim 3 wherein the controller compares the value of $P_{I\text{-}TARGET}$ to the value of $P_Q$, wherein if the values of $P_{I\text{-}TARGET}$ and $P_Q$ are not substantially the same, the controller incrementally adjusts the value of the amplitude compensation value until the values of $P_{I\text{-}TARGET}$ and $P_Q$ are substantially the same.

5. The DBB transmitter of claim 4 wherein the controller simultaneously applies the first reference signal to the real signal path and the second reference signal to the imaginary signal path, reduces the power level of the first and second reference signals by half, and receives a third detected reading having a value $P_{PHASE\text{-}ERROR}$ in response to the simultaneously applied first and second reference signals.

6. The DBB transmitter of claim 5 wherein the controller compares the value of $P_{PHASE\text{-}ERROR}$ to the value of $P_{I\text{-}TARGET}$, and if the values of $P_{PHASE\text{-}ERROR}$ and $P_{I\text{-}TARGET}$ are not substantially the same, the controller incrementally adjusts the value of the phase compensation value until the values of $P_{PHASE\text{-}ERROR}$ and $P_{I\text{-}TARGET}$ are substantially the same, indicating that the phases of the real and imaginary signal paths are orthogonal to each other.

7. The DBB transmitter of claim 1 further comprising:
    an analog radio transmitter in communication with the digital amplitude imbalance compensation module and the digital phase imbalance compensation module; and
    a memory in communication with the controller, the memory for storing at least one of the phase and amplitude compensation values.

8. The DBB transmitter of claim 7 wherein the analog radio transmitter further includes a temperature sensor in communication with the controller, and the controller determines the amplitude and phase compensation values if the temperature sensor detects a change in temperature greater than a predetermined threshold, or a temperature excursion beyond a predetermined value or range.

9. The DBB transmitter of claim 8 wherein the analog radio transmitter further comprises an amplifier, wherein the controller sets the amplifier to a predetermined gain level, prior to determining the amplitude and phase compensation values.

10. The DBB transmitter of claim 1 wherein the controller sets a previously determined phase compensation value to zero, prior to determining a new phase compensation value.

11. The DBB transmitter of claim 1 wherein the DBB transmitter processes communication signals which include first and second time slots separated by a guard period, and the controller determines the amplitude and phase compensation values during at least a portion of the guard period.

12. The DBB transmitter of claim 1 wherein the digital phase imbalance compensation module comprises:
    a first adder having a first input and first and second outputs, the first input being coupled to the real signal input of the digital phase imbalance compensation module, and the first output being coupled to a real signal output of the digital phase imbalance compensator module;
    a second adder having second and third inputs and a third output, the second input being coupled to the imaginary signal input of the digital phase imbalance compensation module, and the third output being coupled to an imaginary signal output of the digital phase imbalance compensator module;
    a first multiplier having fourth and fifth inputs and a fourth output, the fourth fifth input being coupled to the imaginary signal input of the digital phase imbalance compensation module, and the fourth output being coupled to the second output of the first adder; and
    a second multiplier having sixth and seventh inputs and a fifth output, the sixth input being coupled to the real signal input of the digital phase imbalance compensation module, the fifth output being coupled to the third input of the second adder, and the seventh input of the second multiplier being coupled to the fourth output of the first multiplier and to the controller for receiving the phase adjustment signal.

13. The DBB transmitter of claim 1 wherein the digital amplitude imbalance compensation module comprises:
a multiplier having a first input coupled to the imaginary signal input of the digital amplitude imbalance compensation module, a second input coupled to the controller for receiving the amplitude adjustment signal, and a first output; and
an adder having a third input coupled to the imaginary signal input of the digital amplitude imbalance compensation module, a fourth input connected to the first output of the multiplier, and a second output connected to an imaginary signal output of the digital amplitude imbalance compensation module.

14. The DBB transmitter of claim 1 wherein the controller sets a previously determined amplitude compensation value to zero, prior to determining a new amplitude compensation value.

15. A digital baseband (DBB) transmitter comprising:
a digital phase imbalance compensation module having real and imaginary signal paths and being configured to adjust the phase difference between the real and imaginary signal paths; and
a controller in communication with the digital phase imbalance compensation module and being configured to determine a phase compensation value used to adjust the phase difference between the real and imaginary signal paths to 90 degrees;
a digital amplitude imbalance compensation module in communication with the controller and having real and imaginary signal paths in communication with the real and imaginary signal paths of the digital phase imbalance compensation module, respectively, wherein the controller determines an amplitude compensation value used by the digital amplitude imbalance compensation module to adjust the amplitude characteristics of the imaginary signal path such that the real and imaginary signal paths substantially have the same amplitude;
a modem switchably connected to the real and imaginary signal paths of the digital amplitude imbalance compensation module, the modem having real and imaginary signal outputs; and
first and second switches connected to the real and imaginary signal outputs of the modem, the real and imaginary signal paths of the digital amplitude imbalance compensation module and the controller, wherein the amplitude and phase compensation values are determined after the switches disconnect the modem from the real and imaginary signal paths of the digital amplitude imbalance compensation module and connect the controller to the real and imaginary signal paths of the digital amplitude imbalance compensation module.

16. The DBB transmitter of claim 15 wherein the controller disables the imaginary signal path of the digital amplitude imbalance compensation module, applies a first reference signal to the real signal path of the digital amplitude imbalance compensation module, and receives a first detected reading having a value $P_{I\text{-}TARGET}$ in response to the first reference signal.

17. The DBB transmitter of claim 16 wherein the controller disables the real signal path of the digital amplitude imbalance compensation module, applies a second reference signal to the imaginary signal path of the digital amplitude imbalance compensation module, and receives a second detected reading having a value $P_Q$ in response to the second reference signal.

18. The DBB transmitter of claim 15 wherein the controller compares the value of $P_{I\text{-}TARGET}$ to the value of $P_Q$, wherein if the values of $P_{I\text{-}TARGET}$ and $P_Q$ are not substantially the same, the controller incrementally adjusts the value of the amplitude compensation value until the values of $P_{I\text{-}TARGET}$ and $P_Q$ are substantially the same.

19. The DBB transmitter of claim 18 wherein the controller simultaneously applies the first reference signal to the real signal path and the second reference signal to the imaginary signal path, reduces the power level of the first and second reference signals by half, and receives a third detected reading having a value $P_{PHASE\text{-}ERROR}$ in response to the simultaneously applied first and second reference signals.

20. The DBB transmitter of claim 19 wherein the controller compares the value of $P_{PHASE\text{-}ERROR}$ to the value of $P_{I\text{-}TARGET}$, and if the values of $P_{PHASE\text{-}ERROR}$ and $P_{I\text{-}TARGET}$ are not substantially the same, the controller incrementally adjusts the value of the phase compensation value until the values of $P_{PHASE\text{-}ERROR}$ and $P_{I\text{-}TARGET}$ are substantially the same, indicating that the phase difference between the real and imaginary signal paths is 90 degrees.

21. The DBB transmitter of claim 15 further comprising:
an analog radio transmitter in communication with the digital amplitude imbalance compensation module and the digital phase imbalance compensation module; and
a memory in communication with the controller, the memory for storing at least one of the phase and amplitude compensation values.

22. The DBB transmitter of claim 21 wherein the analog radio transmitter further includes a temperature sensor in communication with the controller, and the controller determines the amplitude and phase compensation values if the temperature sensor detects a change in temperature greater than a predetermined threshold, or a temperature excursion beyond a predetermined value or range.

23. The DBB transmitter of claim 22 wherein the analog radio transmitter further comprises an amplifier, wherein the controller sets the amplifier to a predetermined gain level, prior to determining the amplitude and phase compensation values.

24. The DBB transmitter of claim 15 wherein the controller sets a previously determined amplitude compensation value to zero, prior to determining a new amplitude compensation value.

25. The DBB transmitter of claim 15 wherein the DBB transmitter processes communication signals which include first and second time slots separated by a guard period, and the controller determines the amplitude and phase values during at least a portion of the guard period.

26. The DBB transmitter of claim 15 wherein the digital amplitude imbalance compensation module comprises:
a multiplier having a first input coupled to the imaginary signal input of the digital amplitude imbalance compensation module, a second input coupled to the controller for receiving the amplitude adjustment signal, and a first output; and
an adder having a third input coupled to the imaginary signal input of the digital amplitude imbalance compensation module, a fourth input connected to the first output of the multiplier, and a second output connected to an imaginary signal output of the digital amplitude imbalance compensation module.

27. The DBB transmitter of claim 15 wherein the digital phase imbalance compensation module comprises:

a first adder having a first input and first and second outputs, the first input being coupled to the real signal input of the digital phase imbalance compensation module, and the first output being coupled to a real signal output of the digital phase imbalance compensator module;

a second adder having second and third inputs and a third output, the second input being coupled to the imaginary signal input of the digital phase imbalance compensation module, and the third output being coupled to an imaginary signal output of the digital phase imbalance compensator module;

a first multiplier having fourth and fifth inputs and a fourth output, the fourth input being coupled to the imaginary signal input of the digital phase imbalance compensation module, and the fourth output being coupled to the second output of the first adder; and a second multiplier having sixth and seventh inputs and a fifth output, the sixth input being coupled to the real signal input of the digital phase imbalance compensation module, the fifth output being coupled to the third input of the second adder, and the seventh input of the second multiplier being coupled to the fourth output of the first multiplier and to the controller for receiving the phase adjustment signal.

28. The DBB transmitter of claim 15 wherein the controller sets a previously determined phase compensation value to zero, prior to determining a new phase compensation value.

29. A wireless transmit/receive unit (WTRU) comprising:

a digital amplitude imbalance compensation module having real and imaginary signal paths, the digital amplitude imbalance compensation module being configured to adjust the amplitude characteristics of the real and imaginary signal paths;

a controller in communication with the digital amplitude imbalance compensation module, the controller being configured to determine an amplitude compensation value used to adjust the amplitude characteristics of the imaginary signal path such that the real and imaginary signal paths substantially have the same amplitude;

a digital phase imbalance compensation module in communication with the controller and having real and imaginary signal paths in communication with the real and imaginary signal paths of the digital amplitude imbalance compensation module, respectively, wherein the controller determines a phase compensation value used by the digital phase imbalance compensation module to adjust the phase difference between the real and imaginary signal paths to 90 degrees;

a modem switchably connected to the real and imaginary signal paths of the digital amplitude imbalance compensation module, the modem having real and imaginary signal outputs; and first and second switches connected to the real and imaginary signal outputs of the modem, the real and imaginary signal paths of the digital amplitude imbalance compensation module and the controller, wherein the amplitude and phase compensation values are determined after the switches disconnect the modem from the real and imaginary signal paths of the digital amplitude imbalance compensation module and connect the controller to the real and imaginary signal paths of the digital amplitude imbalance compensation module.

30. The WTRU of claim 29 wherein the controller disables the imaginary signal path of the digital amplitude imbalance compensation module, applies a first reference signal to the real signal path of the digital amplitude imbalance compensation module, and receives a first detected reading having a value $P_{I\text{-}TARGET}$ in response to the first reference signal.

31. The WTRU of claim 30 wherein the controller disables the real signal path of the digital amplitude imbalance compensation module, applies a second reference signal to the imaginary signal path of the digital amplitude imbalance compensation module, and receives a second detected reading having a value $P_Q$ in response to the second reference signal.

32. The WTRU of claim 31 wherein the controller compares the value of $P_{I\text{-}TARGET}$ to the value of $P_Q$, wherein if the values of $P_{I\text{-}TARGET}$ and $P_Q$ are not substantially the same, the controller incrementally adjusts the value of the amplitude compensation value until the values of $P_{I\text{-}TARGET}$ and $P_Q$ are substantially the same.

33. The WTRU of claim 32 wherein the controller simultaneously applies the first reference signal to the real signal path and the second reference signal to the imaginary signal path, reduces the power level of the first and second reference signals by half, and receives a third detected reading having a value $P_{PHASE\text{-}ERROR}$ in response to the simultaneously applied first and second reference signals.

34. The WTRU of claim 33 wherein the controller compares the value of $P_{PHASE\text{-}ERROR}$ to the value of $P_{I\text{-}TARGET}$, and if the values of $P_{PHASE\text{-}ERROR}$ and $P_{I\text{-}TARGET}$ are not substantially the same, the controller incrementally adjusts the value of the phase compensation value until the values of $P_{PHASE\text{-}ERROR}$ and $P_{I\text{-}TARGET}$ are substantially the same, indicating that the phases of the real and imaginary signal paths are orthogonal to each other.

35. The WTRU of claim 29 further comprising:

an analog radio transmitter in communication with the digital amplitude imbalance compensation module and the digital phase imbalance compensation module; and a memory in communication with the controller, the memory for storing at least one of the phase and amplitude compensation values.

36. The WTRU of claim 35 wherein the analog radio transmitter further includes a temperature sensor in communication with the controller, and the controller determines the amplitude and phase compensation values if the temperature sensor detects a change in temperature greater than a predetermined threshold, or a temperature excursion beyond a predetermined value or range.

37. The WTRU of claim 36 wherein the analog radio transmitter further comprises an amplifier, wherein the controller sets the amplifier to a predetermined gain level, prior to determining the amplitude and phase compensation values.

38. The WTRU of claim 29 wherein the controller sets a previously determined phase compensation value to zero, prior to determining a new phase compensation value.

39. The WTRU of claim 29 wherein the WTRU processes communication signals which include first and second time slots separated by a guard period, and the controller determines the amplitude and phase compensation values during at least a portion of the guard period.

40. The WTRU of claim 29 wherein the digital phase imbalance compensation module comprises:

a first adder having a first input first and second outputs, the first input being coupled to the real signal input of the digital phase imbalance compensation module, and the first output being coupled to a real signal output of the digital phase imbalance compensator module;

a second adder having second and third inputs and a third output, the second input being coupled to the imaginary signal input of the digital phase imbalance compensation module, and the third output being coupled to an imaginary signal output of the digital phase imbalance compensator module;

a first multiplier having fourth and fifth inputs and a fourth output, the fourth input being coupled to the imaginary signal input of the digital phase imbalance compensation module, and the fourth output being coupled to the second output of the first adder; and a second multiplier having sixth and seventh inputs and a fifth output, the sixth input being coupled to the real signal input of the digital phase imbalance compensation module, the fifth output being coupled to the third input of the second adder, and the seventh input of the second multiplier being coupled to the fourth output of the first multiplier and to the controller for receiving the phase adjustment signal.

41. The WTRU of claim 29 wherein the digital amplitude imbalance compensation module comprises:

a multiplier having a first input coupled to the imaginary signal input of the digital amplitude imbalance compensation module, a second input coupled to the controller for receiving the amplitude adjustment signal, and a first output; and an adder having a third input coupled to the imaginary signal input of the digital amplitude imbalance compensation module, a fourth input connected to the first output of the multiplier, and a second output connected to an imaginary signal output of the digital amplitude imbalance compensation module.

42. The WTRU of claim 29 wherein the controller sets a previously determined amplitude compensation value to zero, prior to determining a new amplitude compensation value.

43. A wireless transmit/receive unit (WTRU) comprising:

a digital phase imbalance compensation module having real and imaginary signal paths and being configured to adjust the phase difference between the real and imaginary signal paths; and a controller in communication with the digital phase imbalance compensation module and being configured to determine a phase compensation value used to adjust the phase difference between the real and imaginary signal paths to 90 degrees;

a digital amplitude imbalance compensation module in communication with the controller and having real and imaginary signal paths in communication with the real and imaginary signal paths of the digital phase imbalance compensation module, respectively, wherein the controller determines an amplitude compensation value used by the digital amplitude imbalance compensation module to adjust the amplitude characteristics of the imaginary signal path such that the real and imaginary signal paths substantially have the same amplitude;

a modem switchably connected to the real and imaginary signal paths of the digital amplitude imbalance compensation module, the modem having real and imaginary signal outputs; and first and second switches connected to the real and imaginary signal outputs of the modem, the real and imaginary signal paths of the digital amplitude imbalance compensation module and the controller, wherein the amplitude and phase compensation values are determined after the switches disconnect the modem from the real and imaginary signal paths of the digital amplitude imbalance compensation module and connect the controller to the real and imaginary signal paths of the digital amplitude imbalance compensation module.

44. The WTRU of claim 43 wherein the controller disables the imaginary signal path of the digital amplitude imbalance compensation module, applies a first reference signal to the real signal path of the digital amplitude imbalance compensation module, and receives a first detected reading having a value $P_{I\text{-}TARGET}$ in response to the first reference signal.

45. The WTRU of claim 44 wherein the controller disables the real signal path of the digital amplitude imbalance compensation module, applies a second reference signal to the imaginary signal path of the digital amplitude imbalance compensation module, and receives a second detected reading having a value $P_Q$ in response to the second reference signal.

46. The WTRU of claim 45 wherein the controller compares the value of $P_{I\text{-}TARGET}$ to the value of $P_Q$, wherein if the values of $P_{I\text{-}TARGET}$ and $P_Q$ are not substantially the same, the controller incrementally adjusts the value of the amplitude compensation value until the values of $P_{I\text{-}TARGET}$ and $P_Q$ are substantially the same.

47. The WTRU of claim 46 wherein the controller simultaneously applies the first reference signal to the real signal path and the second reference signal to the imaginary signal path, reduces the power level of the first and second reference signals by half, and receives a third detected reading having a value $P_{PHASE\text{-}ERROR}$ in response to the simultaneously applied first and second reference signals.

48. The WTRU of claim 47 wherein the controller compares the value of $P_{PHASE\text{-}ERROR}$ to the value of $P_{I\text{-}TARGET}$, and if the values of $P_{PHASE\text{-}ERROR}$ and $P_{I\text{-}TARGET}$ are not substantially the same, the controller incrementally adjusts the value of the phase compensation value until the values of $P_{PHASE\text{-}ERROR}$ and $P_{I\text{-}TARGET}$ are substantially the same, indicating that the phase difference between the real and imaginary signal paths is 90 degrees.

49. The WTRU of claim 43 further comprising:

an analog radio transmitter in communication with the digital amplitude imbalance compensation module and the digital phase imbalance compensation module; and a memory in communication with the controller, the memory for storing at least one of the phase and amplitude compensation values.

50. The WTRU of claim 49 wherein the analog radio transmitter further includes a temperature sensor in communication with the controller, and the controller determines the amplitude and phase compensation values if the temperature sensor detects a change in temperature greater than a predetermined threshold, or a temperature excursion beyond a predetermined value or range.

51. The WTRU of claim 50 wherein the analog radio transmitter further comprises an amplifier, wherein the controller sets the amplifier to a predetermined gain level, prior to determining the amplitude and phase compensation values.

52. The WTRU of claim 43 wherein the controller sets a previously determined amplitude compensation value to zero, prior to determining a new amplitude compensation value.

53. The WTRU of claim 43 wherein the WTRU processes communication signals which include first and second time slots separated by a guard period, and the controller determines the amplitude and phase values during at least a portion of the guard period.

54. The WTRU of claim 43 wherein the digital amplitude imbalance compensation module comprises:

a multiplier having a first input coupled to the imaginary signal input of the digital amplitude imbalance compensation module, a second input coupled to the controller for receiving the amplitude adjustment signal, and a first output; and an adder having a third input coupled to the imaginary signal input of the digital amplitude imbalance compensation module, a fourth input connected to the first output of the multiplier, and a second output connected to an imaginary signal output of the digital amplitude imbalance compensation module.

55. The WTRU of claim 43 wherein the digital phase imbalance compensation module comprises:

a first adder having a first input first and second outputs, the first input being coupled to the real signal input of the digital phase imbalance compensation module, and the first output being coupled to a real signal output of the digital phase imbalance compensator module;

a second adder having second and third inputs and a third output, the second input being coupled to the imaginary signal input of the digital phase imbalance compensation module, and the third output being coupled to an imaginary signal output of the digital phase imbalance compensator module;

a first multiplier having fourth and fifth inputs and a fourth output, the fourth input being coupled to the imaginary signal input of the digital phase imbalance compensation module, and the fourth output being coupled to the second output of the first adder; and a second multiplier having sixth and seventh inputs and a fifth output, the sixth input being coupled to the real signal input of the digital phase imbalance compensation module, the fifth output being coupled to the third input of the second adder, and the seventh input of the second multiplier being coupled to the fourth output of the first multiplier and to the controller for receiving the phase adjustment signal.

56. The WTRU of claim 43 wherein the controller sets a previously determined phase compensation value to zero, prior to determining a new phase compensation value.

57. An integrated circuit (IC) comprising:

a digital amplitude imbalance compensation module having real and imaginary signal paths, the digital amplitude imbalance compensation module being configured to adjust the amplitude characteristics of the real and imaginary signal paths;

a controller in communication with the digital amplitude imbalance compensation module, the controller being configured to determine an amplitude compensation value used to adjust the amplitude characteristics of the imaginary signal path such that the real and imaginary signal paths substantially have the same amplitude;

a digital phase imbalance compensation module in communication with the controller and having real and imaginary signal paths in communication with the real and imaginary signal paths of the digital amplitude imbalance compensation module, respectively, wherein the controller determines a chase compensation value used by the digital phase imbalance compensation module to adjust the phase difference between the real and imaginary signal paths to 90 degrees;

a modem switchably connected to the real and imaginary signal paths of the digital amplitude imbalance compensation module, the modem having real and imaginary signal outputs; and first and second switches connected to the real and imaginary signal outputs of the modem, the real and imaginary signal paths of the digital amplitude imbalance compensation module and the controller, wherein the amplitude and phase compensation values are determined after the switches disconnect the modem from the real and imaginary signal paths of the digital amplitude imbalance compensation module and connect the controller to the real and imaginary signal paths paths of the digital amplitude imbalance compensation module.

58. The IC of claim 57 wherein the controller disables the imaginary signal path of the digital amplitude imbalance compensation module, applies a first reference signal to the real signal path of the digital amplitude imbalance compensation module, and receives a first detected reading having a value $P_{I\text{-}TARGET}$ in response to the first reference signal.

59. The IC of claim 58 wherein the controller disables the real signal path of the digital amplitude imbalance compensation module, applies a second reference signal to the imaginary signal path of the digital amplitude imbalance compensation module, and receives a second detected reading having a value $P_Q$ in response to the second reference signal.

60. The IC of claim 59 wherein the controller compares the value of $P_{I\text{-}TARGET}$ to the value of $P_Q$, wherein if the values of $P_{I\text{-}TARGET}$ and $P_Q$ are not substantially the same, the controller incrementally adjusts the value of the amplitude compensation value until the values of $P_{I\text{-}TARGET}$ and $P_Q$ are substantially the same.

61. The IC of claim 60 wherein the controller simultaneously applies the first reference signal to the real signal path and the second reference signal to the imaginary signal path, reduces the power level of the first and second reference signals by half, and receives a third detected reading having a value $P_{PHASE\text{-}ERROR}$ in response to the simultaneously applied first and second reference signals.

62. The IC of claim 61 wherein the controller compares the value of $P_{PHASE\text{-}ERROR}$ to the value of $P_{I\text{-}TARGET}$, and if the values of $P_{PHASE\text{-}ERROR}$ and $P_{I\text{-}TARGET}$ are not substantially the same, the controller incrementally adjusts the value of the phase compensation value until the values of $P_{PHASE\text{-}ERROR}$ and $P_{I\text{-}TARGET}$ are substantially the same, indicating that the phases of the real and imaginary signal paths are orthogonal to each other.

63. The IC of claim 57 further comprising:

an analog radio transmitter in communication with the digital amplitude imbalance compensation module and the digital phase imbalance compensation module; and a memory in communication with the controller, the memory for storing at least one of the phase and amplitude compensation values.

64. The IC of claim 63 wherein the analog radio transmitter further includes a temperature sensor in communication with the controller, and the controller determines the amplitude and phase compensation values if the temperature sensor detects a change in temperature greater than a predetermined threshold, or a temperature excursion beyond a predetermined value or range.

65. The IC of claim 64 wherein the analog radio transmitter further comprises an amplifier, wherein the controller sets the amplifier to a predetermined gain level, prior to determining the amplitude and phase compensation values.

66. The IC of claim 57 wherein the controller sets a previously determined phase compensation value to zero, prior to determining a new phase compensation value.

67. The IC of claim 57 wherein the IC processes communication signals which include first and second time slots separated by a guard period, and the controller determines the amplitude and phase compensation values during at least a portion of the guard period.

68. The IC of claim 57 wherein the digital phase imbalance compensation module comprises:

a first adder having a first input first and second outputs, the first input being coupled to the real signal input of the digital phase imbalance compensation module, and the first output being coupled to a real signal output of the digital phase imbalance compensator module;

a second adder having second and third inputs and a third output, the second input being coupled to the imaginary signal input of the digital phase imbalance compensation module, and the third output being coupled to an imaginary signal output of the digital phase imbalance compensator module;

a first multiplier having fourth and fifth inputs and a fourth output, the fourth input being coupled to the imaginary signal input of the digital phase imbalance compensation module, and the fourth output being coupled to the second output of the first adder; and a second multiplier having sixth and seventh inputs and a fifth output, the sixth input being coupled to the real signal input of the digital phase imbalance compensation module, the fifth output being coupled to the third input of the second adder, and the seventh input of the second multiplier being coupled to the fourth output of the first multiplier and to the controller for receiving the phase adjustment signal.

69. The IC of claim 57 wherein the digital amplitude imbalance compensation module comprises:

a multiplier having a first input coupled to the imaginary signal input of the digital amplitude imbalance compensation module, a second input coupled to the controller for receiving the amplitude adjustment signal, and a first output; and an adder having a third input coupled to the imaginary signal input of the digital amplitude imbalance compensation module, a fourth input connected to the first output of the multiplier, and a second output connected to an imaginary signal output of the digital amplitude imbalance compensation module.

70. The IC of claim 57 wherein the controller sets a previously determined amplitude compensation value to zero, prior to determining a new amplitude compensation value.

71. An integrated circuit (IC) comprising:

a digital phase imbalance compensation module having real and imaginary signal paths and being configured to adjust the phase difference between the real and imaginary signal paths; and a controller in communication with the digital phase imbalance compensation module and being configured to determine a phase compensation value used to adjust the phase difference between the real and imaginary signal paths to 90 degrees;

a digital amplitude imbalance compensation module in communication with the controller and having real and imaginary signal paths in communication with the real and imaginary signal paths paths of the digital phase imbalance compensation module, respectively, wherein the controller determines an amplitude compensation value used by the digital amplitude imbalance compensation module to adjust the amplitude characteristics of the imaginary signal path such that the real and imaginary signal paths substantially have the same amplitude;

a modem switchably connected to the real and imaginary signal paths paths of the digital amplitude imbalance compensation module, the modem having real and imaginary signal outputs; and first and second switches connected to the real and imaginary signal outputs of the modem, the real and imaginary signal paths paths of the digital amplitude imbalance compensation module and the controller, wherein the amplitude and phase compensation values are determined after the switches disconnect the modem from the real and imaginary signal paths paths of the digital amplitude imbalance compensation module and connect the controller to the real and imaginary signal paths of the digital amplitude imbalance compensation module.

72. The IC of claim 71 wherein the controller disables the imaginary signal path of the digital amplitude imbalance compensation module, applies a first reference signal to the real signal path of the digital amplitude imbalance compensation module, and receives a first detected reading having a value $P_{I-TARGET}$ in response to the first reference signal.

73. The IC of claim 72 wherein the controller disables the real signal path of the digital amplitude imbalance compensation module, applies a second reference signal to the imaginary signal path of the digital amplitude imbalance compensation module, and receives a second detected reading having a value $P_Q$ in response to the second reference signal.

74. The IC of claim 73 wherein the controller compares the value of $P_{I-TARGET}$ to the value of $P_Q$, wherein if the values of $P_{I-TARGET}$ and $P_Q$ are not substantially the same, the controller incrementally adjusts the value of the amplitude compensation value until the values of $P_{I-TARGET}$ and $P_Q$ are substantially the same.

75. The IC of claim 74 wherein the controller simultaneously applies the first reference signal to the real signal path and the second reference signal to the imaginary signal path, reduces the power level of the first and second reference signals by half, and receives a third detected reading having a value $P_{PHASE-ERROR}$ in response to the simultaneously applied first and second reference signals.

76. The IC of claim 75 wherein the controller compares the value of $P_{PHASE-ERROR}$ to the value of $P_{I-TARGET}$, and if the values of $P_{PHASE-ERROR}$ and $P_{I-TARGET}$ are not substantially the same, the controller incrementally adjusts the value of the phase compensation value until the values of $P_{PHASE-ERROR}$ and $P_{I-TARGET}$ are substantially the same, indicating that the phase difference between the real and imaginary signal paths is 90 degrees.

77. The IC of claim 71 further comprising:

an analog radio transmitter in communication with the digital amplitude imbalance compensation module and the digital phase imbalance compensation module; and a memory in communication with the controller, the memory for storing at least one of the phase and amplitude compensation values.

78. The IC of claim 77 wherein the analog radio transmitter further includes a temperature sensor in communication with the controller, and the controller determines the amplitude and phase compensation values if the temperature sensor detects a change in temperature greater than a predetermined threshold, or a temperature excursion beyond a predetermined value or range.

79. The IC of claim 78 wherein the analog radio transmitter further comprises an amplifier, wherein the controller sets the amplifier to a predetermined gain level, prior to determining the amplitude and phase compensation values.

80. The IC of claim 71 wherein the controller sets a previously determined amplitude compensation value to zero, prior to determining a new amplitude compensation value.

81. The IC of claim 71 wherein the IC processes communication signals which include first and second time slots separated by a guard period, and the controller determines the amplitude and phase values during at least a portion of the guard period.

82. The IC of claim 71 wherein the digital amplitude imbalance compensation module comprises:
- a multiplier having a first input coupled to the imaginary signal input of the digital amplitude imbalance compensation module, a second input coupled to the controller for receiving the amplitude adjustment signal, and a first output; and
- an adder having a third input coupled to the imaginary signal input of the digital amplitude imbalance compensation module, a fourth input connected to the first output of the multiplier, and a second output connected to an imaginary signal output of the digital amplitude imbalance compensation module.

83. The IC of claim 71 wherein the digital phase imbalance compensation module comprises:
- a first adder having a first input first and second outputs, the first input being coupled to the real signal input of the digital phase imbalance compensation module, and the first output being coupled to a real signal output of the digital phase imbalance compensator module;
- a second adder having second and third inputs and a third output, the second input being coupled to the imaginary signal input of the digital phase imbalance compensation module, and the third output being coupled to an imaginary signal output of the digital phase imbalance compensator module;
- a first multiplier having fourth and fifth inputs and a fourth output, the fourth input being coupled to the imaginary signal input of the digital phase imbalance compensation module, and the fourth output being coupled to the second output of the first adder; and
- a second multiplier having sixth and seventh inputs and a fifth output, the sixth input being coupled to the real signal input of the digital phase imbalance compensation module, the fifth output being coupled to the third input of the second adder, and the seventh input of the second multiplier being coupled to the fourth output of the first multiplier and to the controller for receiving the phase adjustment signal.

84. The IC of claim 71 wherein the controller sets a previously determined phase compensation value to zero, prior to determining a new phase compensation value.

* * * * *

UNITED STATES PATENT AND TRADEMARK OFFICE
CERTIFICATE OF CORRECTION

| | | |
|---|---|---|
| PATENT NO. | : 7,460,614 B2 | Page 1 of 1 |
| APPLICATION NO. | : 10/740047 | |
| DATED | : December 2, 2008 | |
| INVENTOR(S) | : Demir et al. | |

It is certified that error appears in the above-identified patent and that said Letters Patent is hereby corrected as shown below:

At column 8, line 7, before the words "is compared" delete "PII-TARGET" and insert therefore --PI-TARGET--.

At column 8, line 14, before the word "within" delete "is" and insert therefore --are--.

At claim 12, column 10, line 59, after the word "fourth" delete "fifth".

At claim 40, column 14, line 60, after the word "input" insert --and--.

At claim 55, column 17, line 12, after the word "input" insert --and--.

At claim 57, column 17, line 56, after the words "determines a" delete "chase" and insert therefore --phase--.

At claim 68, column 19, line 1, after the word "input" insert --and--.

At claim 71, column 19, line 67, after the word "signal" delete "paths".

At claim 83, column 21, line 16, after the word "input" insert --and--.

Signed and Sealed this

Seventeenth Day of March, 2009

JOHN DOLL
*Acting Director of the United States Patent and Trademark Office*